US008790968B2

(12) United States Patent
Kim

(10) Patent No.: US 8,790,968 B2
(45) Date of Patent: Jul. 29, 2014

(54) RECESSED GATE SILICON-ON-INSULATOR FLOATING BODY DEVICE WITH SELF-ALIGNED LATERAL ISOLATION

(75) Inventor: John Kim, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 419 days.

(21) Appl. No.: 13/113,839

(22) Filed: May 23, 2011

(65) Prior Publication Data

US 2011/0223726 A1    Sep. 15, 2011

Related U.S. Application Data

(62) Division of application No. 12/567,202, filed on Sep. 25, 2009, now Pat. No. 7,947,543.

(60) Provisional application No. 61/100,040, filed on Sep. 25, 2008.

(51) Int. Cl.
*H01L 21/336* (2006.01)
*H01L 21/84* (2006.01)
*H01L 27/108* (2006.01)
*H01L 29/66* (2006.01)

(52) U.S. Cl.
CPC .......... *H01L 21/84* (2013.01); *H01L 27/10802* (2013.01); *H01L 29/66621* (2013.01); *H01L 27/108* (2013.01)
USPC ..................... 438/151; 438/257; 257/E21.411

(58) Field of Classification Search
CPC ............. H01L 21/84; H01L 27/10802; H01L 29/66621; H01L 27/108; H01L 27/2257
USPC .................................................. 438/151, 257
See application file for complete search history.

(56) References Cited

U.S. PATENT DOCUMENTS 3,439,214 A    4/1969   Kabell
3,997,799 A   12/1976   Baker
(Continued)

FOREIGN PATENT DOCUMENTS

CA        272437      7/1927
EP      0 030 856     6/1981
(Continued)

OTHER PUBLICATIONS

Arimoto et al., A Configurable Enhanced T2RAM Macro for System-Level Power Management Unified Memory, 2006, VLSI Symposium.
(Continued)

*Primary Examiner* — Alexander Ghyka
(74) *Attorney, Agent, or Firm* — Wilmer Cutler Pickering Hale and Dorr LLP

(57) ABSTRACT

Embodiments of a manufacturing process for recessed gate devices on silicon-on-insulator (SOI) substrate with self-aligned lateral isolation are described. This allows the creation of true in-pitch recessed gate devices without requiring an extra isolation dimension. A lateral isolation trench is formed between pairs of recessed gate devices by etching the silicon-on-insulator area down to a buried oxide layer on which the silicon-on-insulator layer is formed. The position of the trench is self-aligned and defined by the gate width and the dimension of spacers disposed on either side of the gate. The isolation trench is filled with a dielectric material and then etched back to the middle of the SOI body and the remaining volume is filled with a doped conductive material. The doped conductor is subject to a thermal cycle to create source and drain regions of the device through out-diffusion of the doped material.

10 Claims, 4 Drawing Sheets

(56) References Cited

U.S. PATENT DOCUMENTS

| | | |
|---|---|---|
| 4,032,947 A | 6/1977 | Kesel et al. |
| 4,250,569 A | 2/1981 | Sasaki et al. |
| 4,262,340 A | 4/1981 | Sasaki et al. |
| 4,298,962 A | 11/1981 | Hamano et al. |
| 4,371,955 A | 2/1983 | Sasaki |
| 4,527,181 A | 7/1985 | Sasaki |
| 4,630,089 A | 12/1986 | Sasaki et al. |
| 4,658,377 A | 4/1987 | McElroy |
| 4,791,610 A | 12/1988 | Takemae |
| 4,807,195 A | 2/1989 | Busch et al. |
| 4,954,989 A | 9/1990 | Auberton-Herve et al. |
| 4,979,014 A | 12/1990 | Hieda et al. |
| 5,010,524 A | 4/1991 | Fifield et al. |
| 5,144,390 A | 9/1992 | Matloubian |
| 5,164,805 A | 11/1992 | Lee |
| 5,258,635 A | 11/1993 | Nitayama et al. |
| 5,313,432 A | 5/1994 | Lin et al. |
| 5,315,541 A | 5/1994 | Harari et al. |
| 5,350,938 A | 9/1994 | Matsukawa |
| 5,355,330 A | 10/1994 | Hisamoto et al. |
| 5,382,534 A * | 1/1995 | Sheu et al. ............... 438/302 |
| 5,388,068 A | 2/1995 | Ghoshal et al. |
| 5,397,726 A | 3/1995 | Bergemont et al. |
| 5,432,730 A | 7/1995 | Shubat et al. |
| 5,446,299 A | 8/1995 | Acovic et al. |
| 5,448,513 A | 9/1995 | Hu et al. |
| 5,466,625 A | 11/1995 | Hsieh et al. |
| 5,489,792 A | 2/1996 | Hu et al. |
| 5,506,436 A | 4/1996 | Hayashi et al. |
| 5,515,383 A | 5/1996 | Katoozi |
| 5,526,307 A | 6/1996 | Yiu et al. |
| 5,528,062 A | 6/1996 | Hsieh et al. |
| 5,568,356 A | 10/1996 | Schwartz |
| 5,583,808 A | 12/1996 | Brahmbhatt |
| 5,593,912 A | 1/1997 | Rajeevakumar |
| 5,606,188 A | 2/1997 | Bronner et al. |
| 5,608,250 A | 3/1997 | Kalnitsky |
| 5,627,092 A | 5/1997 | Alsmeier et al. |
| 5,631,186 A | 5/1997 | Park et al. |
| 5,677,867 A | 10/1997 | Hazani |
| 5,696,718 A | 12/1997 | Hartmann |
| 5,740,099 A | 4/1998 | Tanigawa |
| 5,754,469 A | 5/1998 | Hung et al. |
| 5,774,411 A | 6/1998 | Hsieh et al. |
| 5,778,243 A | 7/1998 | Aipperspach et al. |
| 5,780,906 A | 7/1998 | Wu et al. |
| 5,784,311 A | 7/1998 | Assaderaghi et al. |
| 5,798,968 A | 8/1998 | Lee et al. |
| 5,811,283 A | 9/1998 | Sun |
| 5,847,411 A | 12/1998 | Morii |
| 5,877,978 A | 3/1999 | Morishita et al. |
| 5,886,376 A | 3/1999 | Acovic et al. |
| 5,886,385 A | 3/1999 | Arisumi et al. |
| 5,897,351 A | 4/1999 | Forbes |
| 5,929,479 A | 7/1999 | Oyama |
| 5,930,648 A | 7/1999 | Yang |
| 5,936,265 A | 8/1999 | Koga |
| 5,939,745 A | 8/1999 | Park et al. |
| 5,943,258 A | 8/1999 | Houston et al. |
| 5,943,581 A | 8/1999 | Lu et al. |
| 5,960,265 A | 9/1999 | Acovic et al. |
| 5,968,840 A | 10/1999 | Park et al. |
| 5,977,578 A | 11/1999 | Tang |
| 5,982,003 A | 11/1999 | Hu et al. |
| 5,986,914 A | 11/1999 | McClure |
| 6,018,172 A | 1/2000 | Hidaka et al. |
| 6,048,756 A | 4/2000 | Lee et al. |
| 6,081,443 A | 6/2000 | Morishita |
| 6,096,598 A | 8/2000 | Furukawa et al. |
| 6,097,056 A | 8/2000 | Hsu et al. |
| 6,097,624 A | 8/2000 | Chung et al. |
| 6,111,778 A | 8/2000 | MacDonald et al. |
| 6,121,077 A | 9/2000 | Hu et al. |
| 6,133,597 A | 10/2000 | Li et al. |
| 6,157,216 A | 12/2000 | Lattimore et al. |
| 6,171,923 B1 | 1/2001 | Chi et al. |
| 6,177,300 B1 | 1/2001 | Houston et al. |
| 6,177,698 B1 | 1/2001 | Gruening et al. |
| 6,177,708 B1 | 1/2001 | Kuang et al. |
| 6,214,694 B1 | 4/2001 | Leobandung et al. |
| 6,222,217 B1 | 4/2001 | Kunikiyo |
| 6,225,158 B1 | 5/2001 | Furukawa et al. |
| 6,245,613 B1 | 6/2001 | Hsu et al. |
| 6,252,281 B1 | 6/2001 | Yamamoto et al. |
| 6,262,935 B1 | 7/2001 | Parris et al. |
| 6,292,424 B1 | 9/2001 | Ohsawa |
| 6,297,090 B1 | 10/2001 | Kim |
| 6,300,649 B1 | 10/2001 | Hu et al. |
| 6,320,227 B1 | 11/2001 | Lee et al. |
| 6,333,532 B1 | 12/2001 | Davari et al. |
| 6,333,866 B1 | 12/2001 | Ogata |
| 6,350,653 B1 | 2/2002 | Adkisson et al. |
| 6,351,426 B1 | 2/2002 | Ohsawa |
| 6,359,802 B1 | 3/2002 | Lu et al. |
| 6,384,445 B1 | 5/2002 | Hidaka et al. |
| 6,391,658 B1 | 5/2002 | Gates et al. |
| 6,403,435 B1 | 6/2002 | Kang et al. |
| 6,421,269 B1 | 7/2002 | Somasekhar et al. |
| 6,424,011 B1 | 7/2002 | Assaderaghi et al. |
| 6,424,016 B1 | 7/2002 | Houston |
| 6,429,477 B1 | 8/2002 | Mandelman et al. |
| 6,432,769 B1 | 8/2002 | Fukuda et al. |
| 6,440,872 B1 | 8/2002 | Mandelman et al. |
| 6,441,435 B1 * | 8/2002 | Chan ............................ 257/347 |
| 6,441,436 B1 | 8/2002 | Wu et al. |
| 6,466,511 B2 | 10/2002 | Fujita et al. |
| 6,479,862 B1 | 11/2002 | King et al. |
| 6,480,407 B1 | 11/2002 | Keeth |
| 6,492,211 B1 | 12/2002 | Divakaruni et al. |
| 6,518,105 B1 | 2/2003 | Yang et al. |
| 6,531,754 B1 | 3/2003 | Nagano et al. |
| 6,537,871 B2 | 3/2003 | Forbes |
| 6,538,916 B2 | 3/2003 | Ohsawa |
| 6,544,837 B1 | 4/2003 | Divakauni et al. |
| 6,548,848 B2 | 4/2003 | Horiguchi et al. |
| 6,549,450 B1 | 4/2003 | Hsu et al. |
| 6,552,398 B2 | 4/2003 | Hsu et al. |
| 6,552,932 B2 | 4/2003 | Cernea |
| 6,556,477 B2 | 4/2003 | Hsu et al. |
| 6,560,142 B1 | 5/2003 | Ando |
| 6,563,733 B2 | 5/2003 | Liu et al. |
| 6,566,177 B1 | 5/2003 | Radens et al. |
| 6,567,330 B2 | 5/2003 | Fujita et al. |
| 6,573,566 B2 | 6/2003 | Ker et al. |
| 6,574,135 B1 | 6/2003 | Komatsuzaki |
| 6,590,258 B2 | 7/2003 | Divakauni et al. |
| 6,590,259 B2 | 7/2003 | Adkisson et al. |
| 6,617,651 B2 | 9/2003 | Ohsawa |
| 6,621,725 B2 | 9/2003 | Ohsawa |
| 6,632,723 B2 | 10/2003 | Watanabe et al. |
| 6,650,565 B1 | 11/2003 | Ohsawa |
| 6,653,175 B1 | 11/2003 | Nemati et al. |
| 6,686,624 B2 | 2/2004 | Hsu |
| 6,703,673 B2 | 3/2004 | Houston |
| 6,707,118 B2 | 3/2004 | Muljono et al. |
| 6,714,436 B1 | 3/2004 | Burnett et al. |
| 6,721,222 B2 | 4/2004 | Somasekhar et al. |
| 6,825,524 B1 | 11/2004 | Ikehashi et al. |
| 6,861,689 B2 | 3/2005 | Burnett |
| 6,870,225 B2 | 3/2005 | Bryant et al. |
| 6,882,566 B2 | 4/2005 | Nejad et al. |
| 6,888,770 B2 | 5/2005 | Ikehashi |
| 6,894,913 B2 | 5/2005 | Yamauchi |
| 6,897,098 B2 | 5/2005 | Hareland et al. |
| 6,903,984 B1 | 6/2005 | Tang et al. |
| 6,909,151 B2 | 6/2005 | Hareland et al. |
| 6,912,150 B2 | 6/2005 | Portman et al. |
| 6,913,964 B2 | 7/2005 | Hsu |
| 6,936,508 B2 | 8/2005 | Visokay et al. |
| 6,969,662 B2 | 11/2005 | Fazan et al. |
| 6,975,536 B2 | 12/2005 | Maayan et al. |
| 6,982,902 B2 | 1/2006 | Gogl et al. |
| 6,987,041 B2 | 1/2006 | Ohkawa |
| 7,030,436 B2 | 4/2006 | Forbes |

(56) References Cited

U.S. PATENT DOCUMENTS

| | | |
|---|---|---|
| 7,037,790 B2 | 5/2006 | Chang et al. |
| 7,041,538 B2 | 5/2006 | Ieong et al. |
| 7,042,765 B2 | 5/2006 | Sibigtroth et al. |
| 7,061,806 B2 | 6/2006 | Tang et al. |
| 7,085,153 B2 | 8/2006 | Ferrant et al. |
| 7,085,156 B2 | 8/2006 | Ferrant et al. |
| 7,170,807 B2 | 1/2007 | Fazan et al. |
| 7,177,175 B2 | 2/2007 | Fazan et al. |
| 7,187,581 B2 | 3/2007 | Ferrant et al. |
| 7,230,846 B2 | 6/2007 | Keshavarzi |
| 7,233,024 B2 | 6/2007 | Scheuerlein et al. |
| 7,256,459 B2 | 8/2007 | Shino |
| 7,301,803 B2 | 11/2007 | Okhonin et al. |
| 7,301,838 B2 | 11/2007 | Waller |
| 7,317,641 B2 | 1/2008 | Scheuerlein |
| 7,324,387 B1 | 1/2008 | Bergemont et al. |
| 7,335,934 B2 | 2/2008 | Fazan |
| 7,338,862 B2 | 3/2008 | Huo et al. |
| 7,341,904 B2 | 3/2008 | Willer |
| 7,416,943 B2 | 8/2008 | Figura et al. |
| 7,456,439 B1 | 11/2008 | Horch |
| 7,477,540 B2 | 1/2009 | Okhonin et al. |
| 7,492,632 B2 | 2/2009 | Carman |
| 7,517,744 B2 | 4/2009 | Mathew et al. |
| 7,539,041 B2 | 5/2009 | Kim et al. |
| 7,542,340 B2 | 6/2009 | Fisch et al. |
| 7,542,345 B2 | 6/2009 | Okhonin et al. |
| 7,545,694 B2 | 6/2009 | Srinivasa Raghavan et al. |
| 7,606,066 B2 | 10/2009 | Okhonin et al. |
| 7,696,032 B2 | 4/2010 | Kim et al. |
| 2001/0055859 A1 | 12/2001 | Yamada et al. |
| 2002/0030214 A1 | 3/2002 | Horiguchi |
| 2002/0034855 A1 | 3/2002 | Horiguchi et al. |
| 2002/0036322 A1 | 3/2002 | Divakauni et al. |
| 2002/0051378 A1 | 5/2002 | Ohsawa |
| 2002/0064913 A1 | 5/2002 | Adkisson et al. |
| 2002/0070411 A1 | 6/2002 | Vermandel et al. |
| 2002/0072155 A1 | 6/2002 | Liu et al. |
| 2002/0076880 A1 | 6/2002 | Yamada et al. |
| 2002/0086463 A1 | 7/2002 | Houston et al. |
| 2002/0089038 A1 | 7/2002 | Ning |
| 2002/0098643 A1 | 7/2002 | Kawanaka et al. |
| 2002/0110018 A1 | 8/2002 | Ohsawa |
| 2002/0114191 A1 | 8/2002 | Iwata et al. |
| 2002/0130341 A1 | 9/2002 | Horiguchi et al. |
| 2002/0160581 A1 | 10/2002 | Watanabe et al. |
| 2002/0180069 A1 | 12/2002 | Houston |
| 2003/0003608 A1 | 1/2003 | Arikado et al. |
| 2003/0015757 A1 | 1/2003 | Ohsawa |
| 2003/0035324 A1 | 2/2003 | Fujita et al. |
| 2003/0042516 A1 | 3/2003 | Forbes et al. |
| 2003/0047784 A1 | 3/2003 | Matsumoto et al. |
| 2003/0057487 A1 | 3/2003 | Yamada et al. |
| 2003/0057490 A1 | 3/2003 | Nagano et al. |
| 2003/0102497 A1 | 6/2003 | Fried et al. |
| 2003/0112659 A1 | 6/2003 | Ohsawa |
| 2003/0123279 A1 | 7/2003 | Aipperspach et al. |
| 2003/0146474 A1 | 8/2003 | Ker et al. |
| 2003/0146488 A1 | 8/2003 | Nagano et al. |
| 2003/0151112 A1 | 8/2003 | Yamada et al. |
| 2003/0231521 A1 | 12/2003 | Ohsawa |
| 2004/0021137 A1 | 2/2004 | Fazan et al. |
| 2004/0021179 A1 | 2/2004 | Lee |
| 2004/0029335 A1 | 2/2004 | Lee et al. |
| 2004/0075143 A1 | 4/2004 | Bae et al. |
| 2004/0108532 A1 | 6/2004 | Forbes et al. |
| 2004/0188714 A1 | 9/2004 | Scheuerlein et al. |
| 2004/0217420 A1 | 11/2004 | Yeo et al. |
| 2005/0001257 A1 | 1/2005 | Schloesser et al. |
| 2005/0001269 A1 | 1/2005 | Hayashi et al. |
| 2005/0017240 A1 | 1/2005 | Fazan |
| 2005/0047240 A1 | 3/2005 | Ikehashi et al. |
| 2005/0062088 A1 | 3/2005 | Houston |
| 2005/0063224 A1 | 3/2005 | Fazan et al. |
| 2005/0064659 A1 | 3/2005 | Willer |
| 2005/0105342 A1 | 5/2005 | Tang et al. |
| 2005/0111255 A1 | 5/2005 | Tang et al. |
| 2005/0121710 A1 | 6/2005 | Shino |
| 2005/0135169 A1 | 6/2005 | Somasekhar et al. |
| 2005/0141262 A1 | 6/2005 | Yamada et al. |
| 2005/0141290 A1 | 6/2005 | Tang et al. |
| 2005/0145886 A1 | 7/2005 | Keshavarzi et al. |
| 2005/0145935 A1 | 7/2005 | Keshavarzi et al. |
| 2005/0167751 A1 | 8/2005 | Nakajima et al. |
| 2005/0189576 A1 | 9/2005 | Ohsawa |
| 2005/0208716 A1 | 9/2005 | Takaura et al. |
| 2005/0226070 A1 | 10/2005 | Ohsawa |
| 2005/0232043 A1 | 10/2005 | Ohsawa |
| 2005/0242396 A1 | 11/2005 | Park et al. |
| 2005/0265107 A1 | 12/2005 | Tanaka |
| 2006/0043484 A1 | 3/2006 | Cabral et al. |
| 2006/0091462 A1 | 5/2006 | Okhonin et al. |
| 2006/0098481 A1 | 5/2006 | Okhonin et al. |
| 2006/0126374 A1 | 6/2006 | Waller et al. |
| 2006/0131650 A1 | 6/2006 | Okhonin et al. |
| 2006/0223302 A1 | 10/2006 | Chang et al. |
| 2007/0008811 A1 | 1/2007 | Keeth et al. |
| 2007/0023833 A1 | 2/2007 | Okhonin et al. |
| 2007/0045709 A1 | 3/2007 | Yang |
| 2007/0058427 A1 | 3/2007 | Okhonin et al. |
| 2007/0064489 A1 | 3/2007 | Bauser |
| 2007/0085140 A1 | 4/2007 | Bassin |
| 2007/0097751 A1 | 5/2007 | Popoff et al. |
| 2007/0114599 A1 | 5/2007 | Hshieh |
| 2007/0133330 A1 | 6/2007 | Ohsawa |
| 2007/0138524 A1 | 6/2007 | Kim et al. |
| 2007/0138530 A1 | 6/2007 | Okhonin et al. |
| 2007/0187751 A1 | 8/2007 | Hu et al. |
| 2007/0187775 A1 | 8/2007 | Okhonin et al. |
| 2007/0200176 A1 | 8/2007 | Kammler et al. |
| 2007/0252205 A1 | 11/2007 | Hoentschel et al. |
| 2007/0263466 A1 | 11/2007 | Morishita et al. |
| 2007/0278578 A1 | 12/2007 | Yoshida et al. |
| 2008/0049486 A1 | 2/2008 | Gruening-von Schwerin |
| 2008/0083949 A1 | 4/2008 | Zhu et al. |
| 2008/0099808 A1 | 5/2008 | Burnett et al. |
| 2008/0130379 A1 | 6/2008 | Ohsawa |
| 2008/0133849 A1 | 6/2008 | Deml et al. |
| 2008/0146014 A1* | 6/2008 | Ding ............................ 438/597 |
| 2008/0165577 A1 | 7/2008 | Fazan et al. |
| 2008/0253179 A1 | 10/2008 | Slesazeck |
| 2008/0258206 A1 | 10/2008 | Hofmann |
| 2009/0086535 A1 | 4/2009 | Ferrant et al. |
| 2009/0121269 A1 | 5/2009 | Caillat et al. |
| 2009/0127592 A1 | 5/2009 | El-Kareh et al. |
| 2009/0201723 A1 | 8/2009 | Okhonin et al. |
| 2010/0085813 A1 | 4/2010 | Shino |
| 2010/0091586 A1 | 4/2010 | Carman |
| 2010/0110816 A1 | 5/2010 | Nautiyal et al. |

FOREIGN PATENT DOCUMENTS

| | | |
|---|---|---|
| EP | 0 350 057 | 1/1990 |
| EP | 0 354 348 | 2/1990 |
| EP | 0 202 515 | 3/1991 |
| EP | 0 207 619 | 8/1991 |
| EP | 0 175 378 | 11/1991 |
| EP | 0 253 631 | 4/1992 |
| EP | 0 513 923 | 11/1992 |
| EP | 0 300 157 | 5/1993 |
| EP | 0 564 204 | 10/1993 |
| EP | 0 579 566 | 1/1994 |
| EP | 0 362 961 | 2/1994 |
| EP | 0 599 506 | 6/1994 |
| EP | 0 359 551 | 12/1994 |
| EP | 0 366 882 | 5/1995 |
| EP | 0 465 961 | 8/1995 |
| EP | 0 694 977 | 1/1996 |
| EP | 0 333 426 | 7/1996 |
| EP | 0 727 820 | 8/1996 |
| EP | 0 739 097 | 10/1996 |
| EP | 0 245 515 | 4/1997 |
| EP | 0 788 165 | 8/1997 |
| EP | 0 801 427 | 10/1997 |

(56) References Cited

FOREIGN PATENT DOCUMENTS

| | | |
|---|---|---|
| EP | 0 510 607 | 2/1998 |
| EP | 0 537 677 | 8/1998 |
| EP | 0 858 109 | 8/1998 |
| EP | 0 860 878 | 8/1998 |
| EP | 0 869 511 | 10/1998 |
| EP | 0 878 804 | 11/1998 |
| EP | 0 920 059 | 6/1999 |
| EP | 0 924 766 | 6/1999 |
| EP | 0 642 173 | 7/1999 |
| EP | 0 727 822 | 8/1999 |
| EP | 0 933 820 | 8/1999 |
| EP | 0 951 072 | 10/1999 |
| EP | 0 971 360 | 1/2000 |
| EP | 0 980 101 | 2/2000 |
| EP | 0 601 590 | 4/2000 |
| EP | 0 993 037 | 4/2000 |
| EP | 0 836 194 | 5/2000 |
| EP | 0 599 388 | 8/2000 |
| EP | 0 689 252 | 8/2000 |
| EP | 0 606 758 | 9/2000 |
| EP | 0 682 370 | 9/2000 |
| EP | 1 073 121 | 1/2001 |
| EP | 0 726 601 | 9/2001 |
| EP | 0 731 972 | 11/2001 |
| EP | 1 162 663 | 12/2001 |
| EP | 1 162 744 | 12/2001 |
| EP | 1 179 850 | 2/2002 |
| EP | 1 180 799 | 2/2002 |
| EP | 1 191 596 | 3/2002 |
| EP | 1 204 146 | 5/2002 |
| EP | 1 204 147 | 5/2002 |
| EP | 1 209 747 | 5/2002 |
| EP | 0 744 772 | 8/2002 |
| EP | 1 233 454 | 8/2002 |
| EP | 0 725 402 | 9/2002 |
| EP | 1 237 193 | 9/2002 |
| EP | 1 241 708 | 9/2002 |
| EP | 1 253 634 | 10/2002 |
| EP | 0 844 671 | 11/2002 |
| EP | 1 280 205 | 1/2003 |
| EP | 1 288 955 | 3/2003 |
| FR | 2 197 494 | 3/1974 |
| GB | 1 414 228 | 11/1975 |
| JP | H04-176163 A | 6/1922 |
| JP | S62-007149 A | 1/1987 |
| JP | S62-272561 | 11/1987 |
| JP | 02-294076 | 12/1990 |
| JP | 03-171768 | 7/1991 |
| JP | 05-347419 | 12/1993 |
| JP | 08-213624 | 8/1996 |
| JP | H08-213624 A | 8/1996 |
| JP | 08-274277 | 10/1996 |
| JP | H08-316337 A | 11/1996 |
| JP | 09-046688 | 2/1997 |
| JP | 09-082912 | 3/1997 |
| JP | 10-242470 | 9/1998 |
| JP | 11-087649 | 3/1999 |
| JP | 2000-247735 A | 8/2000 |
| JP | 12-274221 A | 9/2000 |
| JP | 12-389106 A | 12/2000 |
| JP | 13-180633 A | 6/2001 |
| JP | 2002-009081 | 1/2002 |
| JP | 2002-083945 | 3/2002 |
| JP | 2002-094027 | 3/2002 |
| JP | 2002-176154 | 6/2002 |
| JP | 2002-246571 | 8/2002 |
| JP | 2002-329795 | 11/2002 |
| JP | 2002-343886 | 11/2002 |
| JP | 2002-353080 | 12/2002 |
| JP | 2003-031693 | 1/2003 |
| JP | 2003-68877 A | 3/2003 |
| JP | 2003-086712 | 3/2003 |
| JP | 2003-100641 | 4/2003 |
| JP | 2003-100900 | 4/2003 |
| JP | 2003-132682 | 5/2003 |
| JP | 2003-203967 | 7/2003 |
| JP | 2003-243528 | 8/2003 |
| JP | 2004-335553 | 11/2004 |
| WO | WO 01/24268 | 4/2001 |
| WO | WO 2005/008778 | 1/2005 |

OTHER PUBLICATIONS

Arimoto, A High-Density Scalable Twin Transistor RAM (TTRAM) With Verify Control for SOI Platform Memory IPs, Nov. 2007, Solid-State Circuits.
Asian Technology Information Program (ATIP) Scoops™, "Novel Capacitorless 1T-DRAM From Single-Gate PD-SOI to Double-Gate FinDRAM", May 9, 2005, 9 pages.
Assaderaghi et al., "A Dynamic Threshold Voltage MOSFET (DTMOS) for Ultra-Low Voltage Operation", IEEE IEDM, 1994, pp. 809-812.
Assaderaghi et al., "A Dynamic Threshold Voltage MOSFET (DTMOS) for Very Low Voltage Operation", IEEE Electron Device Letters, vol. 15, No. 12, Dec. 1994, pp. 510-512.
Assaderaghi et al., "A Novel Silicon-On-Insulator (SOI) MOSFET for Ultra Low Voltage Operation", 1994 IEEE Symposium on Low Power Electronics, pp. 58-59.
Assaderaghi et al., "Dynamic Threshold-Voltage MOSFET (DTMOS) for Ultra-Low Voltage VLSI", IEEE Transactions on Electron Devices, vol. 44, No. 3, Mar. 1997, pp. 414-422.
Assaderaghi et al., "High-Field Transport of Inversion-Layer Electrons and Holes Including Velocity Overshoot", IEEE Transactions on Electron Devices, vol. 44, No. 4, Apr. 1997, pp. 664-671.
Avci, Floating Body Cell (FBC) Memory for 16-nm Technology with Low Variation on Thin Silicon and 10-nm BOX, Oct. 2008, SOI Conference.
Bae, Evaluation of 1T RAM using Various Operation Methods with SOONO (Silicon-On-ONO) device, Dec. 2008, IEDM.
Ban, A Scaled Floating Body Cell (FBC) Memory with High-k+Metal Gate on Thin-Silicon and Thin-BOX for 16-nm Technology Node and Beyond, Jun. 2008, VLSI Symposium.
Ban, Ibrahim, et al., "Floating Body Cell with Independently-Controlled Double Gates for High Density Memory," Electron Devices Meeting, 2006. IEDM '06. International, IEEE, Dec. 11-13, 2006.
Bawedin, Maryline, et al., A Capacitorless 1T Dram on SOI Based on Dynamic Coupling and Double-Gate Operation, IEEE Electron Device Letters, vol. 29, No. 7, Jul. 2008.
Blagojevic et al., Capacitorless 1T DRAM Sensing Scheme Automatice Reference Generation, 2006, IEEE J.Solid State Circuits.
Blalock, T., "A High-Speed Clamped Bit-Line Current-Mode Sense Amplifier", IEEE Journal of Solid-State Circuits, vol. 26, No. 4, Apr. 1991, pp. 542-548.
Butt, Scaling Limits of Double Gate and Surround Gate Z-RAM Cells, 2007, IEEE Trans. On El. Dev.
Chan et al., "Effects of Floating Body on Double Polysilicon Partially Depleted SOI Nonvolatile Memory Cell", IEEE Electron Device Letters, vol. 24, No. 2, Feb. 2003, pp. 75-77.
Chan, et al., "SOI MOSFET Design for All-Dimensional Scaling with Short Channel, Narrow Width and Ultra-thin Films", IEEE IEDM, 1995, pp. 631-634.
Chi et al., "Programming and Erase with Floating-Body for High Density Low Voltage Flash EEPROM Fabricated on SOI Wafers", Proceedings 1995 IEEE International SOI Conference, Oct. 1995, pp. 129-130.
Cho et al., "Novel DRAM Cell with Amplified Capacitor for Embedded Application", IEEE, Jun. 2009.
Cho, A novel capacitor-less DRAM cell using Thin Capacitively-Coupled Thyristor (TCCT), 2005, IEDM.
Choi et al., Current Flow Mechanism in Schottky-Barrier MOSFET and Application to the 1T-DRAM, 2008, SSDM.
Choi, High Speed Flash Memory and 1T-DRAM on Dopant Segregated Schottky Barrier (DSSB) FinFET SONOS Device for Multi-functional SoC Applications, Dec. 2008, IEDM.
Clarke, Junctionless Transistors Could Simply Chip Making, Say Researchers, EE Times, Feb. 2010, www.eetimes.com/showArticle.jhtml?articleID=223100050.

(56) References Cited

OTHER PUBLICATIONS

Colinge, J.P., "An SOI voltage-controlled bipolar-MOS device", IEEE Transactions on Electron Devices, vol. ED-34, No. 4, Apr. 1987, pp. 845-849.
Colinge, Nanowire Transistors Without Junctions, Nature NanoTechnology, vol. 5, 2010, pp. 225-229.
Collaert et al., Optimizing the Readout Bias for the Capacitorless 1T Bulk FinFET RAM Cell, 2009, IEEE EDL.
Collaert, Comparison of scaled floating body RAM architectures, Oct. 2008, SOI Conference.
Ershov, Optimization of Substrate Doping for Back-Gate Control in SOI T-RAM Memory Technology, 2005, SOI Conference.
Ertosun et al., A Highly Scalable Capacitorless Double Gate Quantum Well Single Transistor DRAM: 1T-QW DRAM, 2008, IEEE EDL.
Fazan et al., "A Simple 1-Transistor Capacitor-Less Memory Cell for High Performance Embedded DRAMs", IEEE 2002 Custom Integrated Circuits Conference, Jun. 2002, pp. 99-102.
Fazan, A Highly Manufacturable Capacitor-less 1T-DRAM Concept, 2002, SPIE.
Fazan, et al., "Capacitor-Less 1-Transistor DRAM", 2002 IEEE International SOI Conference, Oct. 2002, pp. 10-13.
Fazan, P., "MOSFET Design Simplifies DRAM", EE Times, May 14, 2002 (3 pages).
Fisch, Beffa, Bassin, Soft Error Performance of Z-RAM Floating Body Memory, 2006, SOI Conference.
Fisch, Carman, Customizing SOI Floating Body Memory Architecture for System Performance and Lower Cost, 2006, Same.
Fisch, Z-RAM® Ultra-Dense Memory for 90nm and Below, 2006, Hot Chips.
Fossum et al., New Insights on Capacitorless Floating Body DRAM Cells, 2007, IEEE EDL.
Fujita, Array Architectureof Floating Body Cell (FBC) with Quasi-Shielded Open Bit Line Scheme for sub-40nm Node, 2008, SOI Conference.
Furuhashi, Scaling Scenario of Floating Body Cell (FBC) Suppressing Vth Variation Due to Random Dopant Fluctuation, Dec. 2008, SOI Conference.
Furuyama et al., "An Experimental 2-bit/Cell Storage DRAM for Macrocell or Memory-on-Logic Application", IEEE Journal of Solid-State Circuits, vol. 24, No. 2, Apr. 1989, pp. 388-393.
Giffard et al., "Dynamic Effects in SOI MOSFET's", IEEE, 1991, pp. 160-161.
Gupta et al., SPICE Modeling of Self Sustained Operation (SSO) to Program Sub-90nm Floating Body Cells, Oct. 2009, Conf on Simulation of Semiconductor Processes & Devices.
Han et al., Bulk FinFET Unified-RAM (URAM) Cell for Multifunctioning NVM and Capacitorless 1T-DRAM, 2008, IEEE EDL.
Han et al., Partially Depleted SONOS FinFET for Unified RAM (URAM) Unified Function for High-Speed 1T DRAM and Nonvolatile Memory, 2008, IEEE EDL.
Han, Energy Band Engineered Unified-RAM (URAM) for Multi-Functioning 1T-DRAM and NVM, Dec. 2008, IEDM.
Han, Parasitic BJT Read Method for High-Performance Capacitorless 1T-DRAM Mode in Unified RAM, Oct. 2009, IEEE EDL.
Hara, Y., "Toshiba's DRAM Cell Piggybacks on SOI Wafer", EE Times, Jun. 2003.
Hu, C., "SOI (Silicon-on-Insulator) for High Speed Ultra Large Scale Integration", Jpn. J. Appl. Phys. vol. 33 (1994) pp. 365-369, Part 1, No. 1B, Jan. 1994.
Idei et al., "Soft-Error Characteristics in Bipolar Memory Cells with Small Critical Charge", IEEE Transactions on Electron Devices, vol. 38, No. 11, Nov. 1991, pp. 2465-2471.
Ikeda et al., "3-Dimensional Simulation of Turn-off Current in Partially Depleted SOI MOSFETs", IEIC Technical Report, Institute of Electronics, Information and Communication Engineers, 1998, vol. 97, No. 557 (SDM97 186-198), pp. 27-34.
Inoh et al., "FBC (Floating Body Cell) for Embedded DRAM on SOI", 2003 Symposium on VLSI Circuits Digest of Technical Papers, Jun. 2003 (2 pages).
Iyer et al., "SOI MOSFET on Low Cost SPIMOX Substrate", IEEE IEDM, Sep. 1998, pp. 1001-1004.
Jang et al., Highly scalable Z-RAM with remarkably long data retention for DRAM application, Jun. 2009, VLSI.
Jeong et al., "A Capacitor-less 1T DRAM Cell Based on a Surrounding Gate MOSFET with Vertical Channel", Technology Development Team, Technology Development Team, Samsung Electronics Co., Ltd., May 2007.
Jeong et al., "A New Capacitorless 1T DRAm Cell: Surrounding Gate MOSFET with Vertical Channel (SGVC Cell)", IEEE Transactions on Nanotechnology, vol. 6, No. 3, May 2007.
Jeong et al., "Capacitorless DRAM Cell with Highly Scalable Surrounding Gate Structure", Extended Abstracts of the 2006 International Conference on Solid State Devices and Materials, pp. 574-575, Yokohama (2006).
Jeong et al., "Capacitorless Dynamic Random Access Memory Cell with Highly Scalable Surrounding Gate Structure", Japanese Journal of Applied Physics, vol. 46, No. 4B, pp. 2143-2147 (2007).
Kedzierski, J.; "Design Analysis of Thin-Body Silicide Source/Drain Devices", 2001 IEEE International SOI Conference, Oct. 2001, pp. 21-22.
Kim et al., "Chip Level Reliability on SOI Embedded Memory", Proceedings 1998 IEEE International SOI Conference, Oct. 1998, pp. 135-139.
Kuo et al., "A Capacitorless Double-Gate DRAM Cell Design for High Density Applications", IEEE IEDM, Feb. 2002, pp. 843-846.
Kuo et al., "A Capacitorless Double-Gate DRAM Cell", IEEE Electron Device Letters, vol. 23, No. 6, Jun. 2002, pp. 345-347.
Kuo et al., A Capacitorless Double Gate DRAM Technology for Sub 100 nm Embedded and Stand Alone Memory Applications, 2003, IEEE Trans. On El. Dev.
Kwon et al., "A Highly Scalable 4F2 DRAm Cell Utilizing a Doubly Gated Vertical Channel", Extended Abstracts of the 2009 International Conference on Solid State Devices and Materials, UC Berkley, pp. 142-143 Sendai (2009).
Lee et al., "A Novel Pattern Transfer Process for Bonded SOI Gigabit DRAMs", Proceedings 1996 IEEE International SOI Conference, Oct. 1996, pp. 114-115.
Leiss et al., dRAM Design Using the Taper-Isolated Dynamic RAM Cell, IEEE Transactions on Electron Devices, vol. ED-29, No. 4, Apr. 1982, pp. 707-714.
Lin et al., "Opposite Side Floating Gate SOI Flash Memory Cell", IEEE, Mar. 2000, pp. 12-15.
Liu et al., Surface Generation-Recombination Processes of Gate and STI Oxide Interfaces Responsible for Junction Leakage on SOI, Sep. 2009, ECS Transactions, vol. 25.
Liu, Surface Recombination-Generation Processes of Gate, STI and Buried Oxide Interfaces Responsible for Junction Leakage on SOI, May 2009, ICSI.
Lončar et al., "One of Application of SOI Memory Cell—Memory Array", IEEE Proc. 22nd International Conference on Microelectronics (MIEL 2000), vol. 2, NIŠ, Serbia, May 14-17, 2000, pp. 455-458.
Lu et al., A Novel Two-Transistor Floating Body/Gate Cell for Low Power Nanoscale Embedded DRAM, 2008, IEEE Trans. on El. Dev.
Ma, et al., "Hot-Carrier Effects in Thin-Film Fully Depleted SOI MOSFET's", IEEE Electron Device Letters, vol. 15, No. 6, Jun. 1994, pp. 218-220.
Malhi et al., "Characteristics and Three-Dimensional Integration of MOSFET's in Small-Grain LPCVD Polycrystalline Silicon", IEEE Transactions on Electron Devices, vol. ED-32, No. 2, Feb. 1985, pp. 258-281.
Malinge, An 8Mbit DRAM Design Using a 1TBulk Cell, 2005, VLSI Circuits.
Mandelman et al, "Floating-Body Concerns for SOI Dynamic Random Access Memory (DRAM)", Proceedings 1996 IEEE International SOI Conference, Oct. 1996, pp. 136-137.
Matsuoka et al., FBC Potential of 6F2 Single Cell Operation in Multi Gbit Memories Confirmed by a Newly Developed Method for Measuring Signal Sense Margin, 2007, IEDM.

(56) References Cited

OTHER PUBLICATIONS

Minami, A Floating Body Cell (FBC) fully Compatible with 90nm CMOS Technology(CMOS IV) for 128Mb SOI DRAM, 2005, IEDM.
Mohapatra et al., Effect of Source/Drain Asymmetry on the Performance of Z-RAM Devices, Oct. 2009, SOI conference.
Morishita, A Capacitorless Twin-Transistor Random Access Memory (TTRAM) on SOI, 2005, CICC.
Morishita, F. et al., "A Configurable Enhanced TTRAM Macro for System-Level Power Management Unified Memory", IEEE Journal of Solid-State Circuits, vol. 42, No. 4, pp. 853, Apr. 2007.
Morishita, F., et al., "A 312-MHz 16-Mb Random-Cycle Embedded DRAM Macro With a Power-Down Data Retention Mode for Mobile Applications", J. Solid-State Circuits, vol. 40, No. 1, pp. 204-212, 2005.
Morishita, F., et al., "Dynamic floating body control SOI CMOS for power managed multimedia ULSIs", Proc. CICC, pp. 263-266, 1997.
Morishita, F., et al., "Leakage Mechanism due to Floating Body and Countermeasure on Dynamic Retention Mode of SOI-DRAM", Symposium on VLSI Technology Digest of Technical Papers, pp. 141-142, 1995.
Nagoga, Studying of Hot Carrier Effect in Floating Body Soi Mosfets by the Transient Charge Pumping Technique, Switzerland 2003.
Nayfeh, A Leakage Current Model for SOI based Floating Body Memory that Includes the Poole-Frenkel Effect, 2008, SOI conference.
Nemati, A Novel High Density, Low Voltage SRAM Cell with a Vertical NDR Device, 1998, VLSI Tech. Symp.
Nemati, A Novel Thyristor-based SRAM Cell (T-RAM) for High-Speed, Low-Voltage, Giga-scale Memories, 1999, IEDM Conference.
Nemati, Embedded Volatile Memories-Embedded Tutorial: The New Memory Revolution, New Drives Circuits and Systems, ICCAD 2008, Nov. 2008.
Nemati, Fully Planar 0.562μm2 T-RAM Cell in a 130nm SOI CMOC Logic Technology for High-Density High-Performance SRAMs, 2004, IEDM.
Nemati, The New Memory Revolution. New Devices, Circuits and Systems, 2008, ICCAD.
Nemati, Thyristor RAM (T-RAM): A High-Speed High-Density Embedded Memory Technology for Nano-scale CMOS, 2007, Hot Chips.
Nemati, Thyristor-RAM: A Novel Embedded Memory Technology that Outperforms Embedded S RAM/DRAM, 2008, Linley Tech Tour.
Nishiguchi et al., Long Retention of Gain-Cell Dynamic Random Access Memory with Undoped Memory Node, 2007, IEEE EDL.
Oh, Floating Body DRAM Characteristics of Silicon-On-ONO (SOONO) Devices for System-on-Chip (SoC) Applications, 2007, VLSI Symposium.
Ohno et al., "Suppression of Parasitic Bipolar Action in Ultra-Thin-Film Fully-Depleted CMOS/SIMOX Devices by Ar-Ion Implantation into Source/Drain Regions", IEEE Transactions on Electron Devices, vol. 45, No. 5, May 1998, pp. 1071-1076.
Ohsawa et al., "A Memory Using One-Transistor Gain Cell on SOI (FBC) with Performance Suitable for Embedded DRAM's", 2003 Symposium on VLSI Circuits Digest of Technical Papers, Jun. 2003 (4 pages).
Ohsawa et al., "Memory Design Using a One-Transistor Gain Cell on SOI", IEEE Journal of Solid-State Circuits, vol. 37, No. 11, Nov. 2002, pp. 1510-1522.
Ohsawa, A 128Mb Floating Body RAM (FBRAM) on SOI with a Multi-Averaging Scheme of Dummy Cell, 2006 Symposium of VLSI Circuits Digest of Tech Papers, (2006).
Ohsawa, An 18.5ns 128Mb SOI DRAM with a Floating Body Cell, 2005, ISSCC.
Ohsawa, Autonomous Refresh of Floating Body Cell (FBC), Dec. 2008, IEDM.
Ohsawa, Design of a 128-Mb SOI DRAM Using the Floating Body Cell (FBC), Jan. 2006, Solid-State Circuits.
Okhonin, A Capacitor-Less 1T-DRAM Cell, Feb. 2002, Electron Device Letters.
Okhonin, A SOI Capacitor-less 1T-DRAM Concept, 2001, SOI Conference.
Okhonin, Charge Pumping Effects in Partially Depleted SOI MOSFETs, 2003, SOI Conference.
Okhonin, New characterization techniques for SOI and related devices, 2003, ECCTD.
Okhonin, New Generation of Z-RAM, 2007, IEDM.
Okhonin, Principles of Transient Charge Pumping on Partially Depleted SOI MOSFETs, May 2002, Electron Device Letters.
Okhonin, Transient Charge Pumping for Partially and Fully Depleted SOI MOSFETs, 2002, SOI Conference.
Okhonin, Transient effects in PD SOI MOSFETs and potential DRAM applications, 2002, Solid-State Electronics.
Okhonin, Ultra-scaled Z-RAM cell, 2008, SOI Conference.
Okhonin, Z-RAM® (Limits of DRAM), 2009, ESSDERC.
Padilla, Alvaro, et al., "Feedback FET: A Novel Transistor Exhibiting Steep Switching Behavior at Low Bias Voltages," Electron Devices Meeting, 2008. IEDM 2008. IEEE International, Dec. 5-17, 2008.
Park, Fully Depleted Double-Gate 1T-DRAM Cell with NVM Function for High Performance and High Density Embedded DRAM, 2009, IMW.
Pelella et al., "Low-Voltage Transient Bipolar Effect Induced by Dynamic Floating-Body Charging in PD/SOI MOSFETs", Final Camera Ready Art, SOI Conference, Oct. 1995, 2 pages.
Portmann et al., "A SOI Current Memory for Analog Signal Processing at High Temperature", 1999 IEEE International SOI Conference, Oct. 1999, pp. 18-19.
Puget et al., 1T Bulk eDRAM using GIDL Current for High Speed and Low Power applications, 2008, SSDM.
Puget et al., Quantum effects influence on thin silicon film capacitorless DRAM performance, 2006, SOI Conference.
Puget, FDSOI Floating Body Cell eDRAM Using Gate-Induced Drain-Leakage (GIDL) Write Current for High Speed and Low Power Applications, 2009, IMW.
Ranica et al., 1T-Bulk DRAM cell with improved performances: the way to scaling, 2005, ICMTD.
Ranica, A capacitor-less DRAM cell on 75nm gate length, 16nm thin Fully Depleted SOI device for high density embedded memories, 2004, IEDM.
Ranica, A One Transistor Cell on Bulk Substrate (1T-Bulk) for Low-Cost and High Density eDRAM, 2004, VLSI Symposium.
Rodder et al., "Silicon-On-Insulator Bipolar Transistors", IEEE Electron Device Letters, vol. EDL-4, No. 6, Jun. 1983, pp. 193-195.
Rodriguez, Noel, et al., A-RAM Novel Capacitor-less DRAM Memory, SOI Conference, 2009 IEEE International, Oct. 5-8, 2009 pp. 1-2.
Roy, Thyristor-Based Volatile Memory in Nano-Scale CMOS, 2006, ISSCC.
Salling et al., Reliability of Thyristor Based Memory Cells, 2009, IRPS.
Sasaki et al., Charge Pumping in SOS-MOS Transistors, 1981, IEEE Trans. On El. Dev.
Sasaki et al., Charge Pumping SOS-MOS Transistor Memory, 1978, IEDM.
Schloesser et al., "A 6F2 Buried Wordline DRAM Cell for 40nm and Beyond", IEEE, Qimonda Dresden GmbH & Co., pp. 809-812 (2008).
Shino et al., Floating Body RAM technology and its scalability to 32 nm node and beyond, 2006, IEDM.
Shino et al., Operation Voltage Dependence of Memory Cell Characteristics in Fully Depleted FBC, 2005, IEEE Trans. On El. Dev.
Shino, Fully-Depleted FBC (Floating Body Cell) with Enlarged Signal Window and Excellent Logic Process Compatibility, 2004, IEDM.
Shino, Highly Scalable FBC (Floating Body Cell) with 25nm BOX Structure for Embedded DRAM Applications, 2004, VLSI Symposium.
Sim et al., "Source-Bias Dependent Charge Accumulation in P+-Poly Gate SOI Dynamic Random Access Memory Cell Transistors", Jpn. J. Appl. Phys. vol. 37 (1998) pp. 1260-1263, Part 1, No. 3B, Mar. 1998.

(56) References Cited

OTHER PUBLICATIONS

Singh, A 2ns-Read-Latency 4Mb Embedded Floating-Body Memory Macro in 45nm SOI Technology, Feb. 2009, ISSCC.
Sinha et al., "In-Depth Analysis of Opposite Channel Based Charge Injection in SOI MOSFETs and Related Defect Creation and Annihilation", Elsevier Science, Microelectronic Engineering 28, 1995, pp. 383-386.
Song, 55 nm Capacitor-less 1T DRAM Cell Transistor with Non-Overlap Structure, Dec. 2008, IEDM.
Stanojevic et al., "Design of a SOI Memory Cell", IEEE Proc. 21st International Conference on Microelectronics (MIEL '97), vol. 1, NIS, Yugoslavia, Sep. 14-17, 1997, pp. 297-300.
Su et al., "Studying the Impact of Gate Tunneling on Dynamic Behaviors of Partially-Depleted SOI CMOS Using BSIMPD", IEEE Proceedings of the International Symposium on Quality Electronic Design (ISQED '02), Apr. 2002 (5 pages).
Suma et al., "An SOI-DRAM with Wide Operating Voltage Range by CMOS/SIMOX Technology", 1994 IEEE International Solid-State Circuits Conference, pp. 138-139.
Tack et al., "The Multi-Stable Behaviour of SOI-NMOS Transistors at Low Temperatures", Proc. 1988 SOS/SOI Technology Workshop (Sea Palms Resort, St. Simons Island, GA, Oct. 1988), p. 78.
Tack et al., "The Multistable Charge Controlled Memory Effect in SOI Transistors at Low Temperatures", IEEE Workshop on Low Temperature Electronics, Aug. 7-8, 1989, University of Vermont, Burlington, pp. 137-141.
Tack et al., "The Multistable Charge-Controlled Memory Effect in SOI MOS Transistors at Low Temperatures", IEEE Transactions on Electron Devices, vol. 37, No. 5, May 1990, pp. 1373-1382.
Tack, et al., "An Analytical Model for the Misis Structure in SOI MOS Devices", Solid-State Electronics vol. 33, No. 3, 1990, pp. 357-364.
Tanaka et al., "Scalability Study on a Capacitorless 1T-DRAM: From Single-gate PD-SOI to Double-gate FINDRAM", 2004 IEEE, 4 pages.
Tang, Poren, Highly Scalable Capacitorless DRAM Cell on Thin-Body with Band-gap Engineered Source and Drain, Extended Abstracts of the 2009 ICSSDM, Sendai, 2009, pp. 144-145.
Terauchi et al., "Analysis of Floating-Body-Induced Leakage Current in 0.15 μm SOI DRAM", Proceedings 1996 IEEE International SOI Conference, Oct. 1996, pp. 138-139.
Thomas et al., "An SOI 4 Transistors Self-Refresh Ultra-Low-Voltage Memory Cell", IEEE, Mar. 2003, pp. 401-404.
Tomishima, et al., "A Long Data Retention SOI DRAM with the Body Refresh Function", IEICE Trans. Electron., vol. E80-C, No. 7, Jul. 1997, pp. 899-904.
Tsaur et al., "Fully Isolated Lateral Bipolar-MOS Transistors Fabricated in Zone-Melting-Recrystallized Si Films on SiO2", IEEE Electron Device Letters, vol. EDL-4, No. 8, Aug. 1983, pp. 269-271.
Tu, et al., "Simulation of Floating Body Effect in SOI Circuits Using BSIM3SOI", Proceedings of Technical Papers (IEEE Cat No. 97TH8303), Jun. 1997, pp. 339-342.
Villaret et al., "Mechanisms of Charge Modulation in the Floating Body of Triple-Well nMOSFET Capacitor-less DRAMs", Proceedings of the INFOS 2003, Insulating Films on Semiconductors, 13th Bi-annual Conference, Jun. 18-20, 2003, Barcelona (Spain), (4 pages).
Villaret et al., "Triple-Well nMOSFET Evaluated as a Capacitor-Less DRAM Cell for Nanoscale Low-Cost & High Density Applications", Handout at Proceedings of 2003 Silicon Nanoelectronics Workshop, Jun. 8-9, 2003, Kyoto, Japan (2 pages).
Villaret et al., Further Insight into the Physics and Modeling of Floating Body Capacitorless DRAMs, 2005, IEEE Trans. On El. Dev.
Wang et al., A Novel 4.5F2 Capacitorless Semiconductor Memory Device, 2008, IEEE EDL.
Wann et al., "A Capacitorless DRAM Cell on SOI Substrate", IEEE IEDM, 1993, pp. 635-638.
Wann et al., "High-Endurance Ultra-Thin Tunnel Oxide in MONOS Device Structure for Dynamic Memory Application", IEEE Electron Device Letters, vol. 16, No. 11, Nov. 1995, pp. 491-493.
Wei, A., "Measurement of Transient Effects in SOI DRAM/SRAM Access Transistors", IEEE Electron Device Letters, vol. 17, No. 5, May 1996, pp. 193-195.
Wouters, et al., "Characterization of Front and Back Si-SiO2 Interfaces in Thick- and Thin-Film Silicon-on-Insulator MOS Structures by the Charge-Pumping Technique", IEEE Transactions on Electron Devices, vol. 36, No. 9, Sep. 1989, pp. 1746-1750.
Wu, Dake, "Performance Improvement of the Capacitorless DRAM Cell with Quasi-SOI Structure Based on Bulk Substrate," Extended Abstracts of the 2009 ICSSDM, Sendai, 2009, pp. 146-147.
Yamanaka et al., "Advanced TFT SRAM Cell Technology Using a Phase-Shift Lithography", IEEE Transactions on Electron Devices, vol. 42, No. 7, Jul. 1995, pp. 1305-1313.
Yamauchi et al., "High-Performance Embedded SOI DRAM Architecture for the Low-Power Supply", IEEE Journal of Solid-State Circuits, vol. 35, No. 8, Aug. 2000, pp. 1169-1178.
Yamawaki, M., "Embedded DRAM Process Technology", Proceedings of the Symposium on Semiconductors and Integrated Circuits Technology, 1998, vol. 55, pp. 38-43.
Yang, Optimization of Nanoscale Thyristors on SOI for High-Performance High-Density Memories, 2006, SOI Conference.
Yoshida et al., "A Design of a Capacitorless 1-T-DRAM Cell Using Gate-induced Drain Leakage (GIDL) Current for Low-Power and High-speed Embedded Memory", 2003 IEEE, 4 pages.
Yoshida et al., "A Study of High Scalable DG-FinDRAM", IEEE Electron Device Letters, vol. 26, No. 9, Sep. 2005, pp. 655-657.
Yoshida et al., A Capacitorless 1T-DRAM Technology Using GIDL Current for Low Power and High Speed Embedded Memory, 2006, IEEE Trans. On El. Dev.
Yu et al., Hot-Carrier Effect in Ultra-Thin-Film (UTF) Fully-Depleted SOI MOSFET's, 54th Annual Device Research Conference Digest (Cat. No. 96TH8193), Jun. 1996, pp. 22-23.
Yu et al., "Hot-Carrier-Induced Degradation in Ultra-Thin-Film Fully-Depleted SOI MOSFETs", Solid-State Electronics, vol. 39, No. 12, 1996, pp. 1791-1794.
Yu et al., "Interface Characterization of Fully-Depleted SOI MOSFET by a Subthreshold I-V Method", Proceedings 1994 IEEE International SOI Conference, Oct. 1994, pp. 63-64.
Yun et al., Analysis of Sensing Margin in SOONO Device for the Capacitor-less RAM Applications, 2007, SOI Conference.
Zhou, Physical Insights on BJT-Based 1T DRAM Cells, IEEE Electron Device Letters, vol. 30, No. 5, May 2009.
Ban et al., Integration of Back-Gate Doping for 15-nm Node Floating Body Cell (FBC) Memory, Components Research, Process Technology Modeling, presented in the 2010 VLSI Symposium on Jun. 17, 2010.
Tanabe et al., A 30-ns 64-MB DRAM with Built-in-Self-Test and Self-Repair Function, IEEE Journal of Solid State Circuits, vol. 27, No. 11, pp. 1525-1533, Nov. 1992.

\* cited by examiner

RECESSED GATE SILICON-ON-INSULATOR FLOATING BODY DEVICE WITH SELF-ALIGNED LATERAL ISOLATION

CROSS-REFERENCE TO RELATED APPLICATIONS

This application is a divisional application of U.S. patent application Ser. No. 12/567,202, filed Sep. 25, 2009, entitled "Recessed Gate Silicon-on-Insulator Floating Body Device with Self-Aligned Lateral Isolation," which claims the benefit of the U.S. Provisional Application No. 61/100,040 entitled "Recessed Gate Silicon-on-Insulator Floating Body Device with Self-Aligned Lateral Isolation," and filed on Sep. 25, 2008. The contents of which are hereby incorporated by reference in their entireties.

FIELD OF THE DISCLOSURE

Embodiments of the invention relate generally to semiconductor manufacturing, and more specifically to manufacturing processes for memory cell circuits.

BACKGROUND OF THE DISCLOSURE

Computing systems typically move vast amounts of data and have three types or levels of memory: on-chip or embedded memory in the processor itself (e.g., embedded SRAM or embedded DRAM), main memory (e.g., standalone DRAM), and non-volatile memory (e.g., hard disk drives, magnetic tape, etc.). Dynamic Random Access Memory (DRAM) is essentially used as the main memory of the system. Over the years, the electronics industry has developed DRAM memories that feature reduced bit cell sizes, higher densities, and reduced costs. In order to gain further cost and miniaturization advantages, a great deal of emphasis has been placed on reducing bit cell size to maximize the amount of memory available in a given amount of silicon area. One important parameter associated with semiconductor memories, such as DRAM devices is the feature size of the transistor device that comprises the memory cell. In general, the feature size of the transistor is denoted F, where F corresponds to the minimum gate length that can be produced in the manufacturing process for a circuit. Under present manufacturing systems, the bit-cell area for a one-transistor, one-capacitor DRAM device is typically on the order of 2F by 3F to 4F, which corresponds to a total area of 6 $F^2$ to 8 $F^2$.

DRAM devices have traditionally been made using a simple one-transistor/one-capacitor structure for the basis of each storage cell. Transistor scaling for ever-smaller (higher density) devices presents many challenges. Among others, at small dimensions, various parasitic effects start to appear. Various processing technologies have been developed to overcome these effects, and allow the continuing miniaturization of microelectronic devices. One such technology is Silicon-on-Insulator (SOI) technology, in which a layered silicon-insulator substrate is used in place of conventional silicon substrates. In an SOI device, the active circuit layer is isolated from the substrate. SOI transistors generally have an electrically floating body region. Recent technology has been developed to use this floating-body as an alternative to discrete-trench or stacked-capacitor structures to store information and create a memory bit cell. One such technology is represented by Z-RAM® cells, which consist of a single transistor per bit-cell, with zero capacitors, thus eliminating the deep trench or the complex stacked capacitor. Z-RAM® was developed by, and is a trademark of Innovative Silicon, Inc. of Switzerland. Aspects of the Z-RAM technology, devices, and manufacture are described in the following United States Patent Applications, among others: U.S. application Ser. No. 12/053,398, filed Mar. 21, 2008, and entitled "Manufacturing Process for Zero-Capacitor Random Access Memory Circuits," and U.S. application Ser. No. 12/019,320, filed Jan. 24, 2008, and entitled "Semiconductor Device with Electrically Floating Body," each of which is herein incorporated by reference in its entirety.

For SOI structures, the floating body effect is usually an undesirable parasitic element. Embodiments of the present invention are directed to using the parasitic floating body effect advantageously as the basis for various new processing technologies. Such embodiments can be applied to SOI processing technology, as well as any other similar isolated body process technology.

As the channel lengths of DRAM devices become smaller, the densities of the devices increase. In the case of a planar transistor, the channel length of the transistor is reduced as the integration density increases. This, in turn, increases the so-called short-channel effect. In a MOSFET device, a short-channel configuration occurs when the channel length is the same order of magnitude as the depletion-layer widths of the source and drain junctions. Short-channel effects can be attributed to the limitation imposed on electron drift characteristics in the channel, and a modification of the device threshold voltage due to shortened channel length. As channel lengths are excessively decreased in planar devices, the likelihood of a device "punchthrough" effect between the source and a drain of the device is increased, resulting in malfunction of the device. Punchthrough can occur when a high voltage is placed across the transistor from the source to the drain. In this case, an undesirable conductive path is formed through the body region when the transistor should be off. One solution to the punchthrough problem is the use of recessed gate manufacturing techniques in which the transistor is made with a three-dimensional shape having a recessed channel to create a recessed channel (or recessed gate) transistor. The recessed gate effectively creates a long gate length of a device without increasing the feature size of the cell due to the vertical orientation of the device in which the current flows in three-dimensions.

In general, the standard method of creating a recessed gate device is not used in an SOI device. FIG. 1 illustrates a partial array of three separate DRAM cells manufactured from SOI technology, under an embodiment. As shown in FIG. 1, a barrier layer 104 is formed on a semiconductor substrate 102. The barrier layer 104 may be formed of an oxide layer, such as the buried oxide layer (BOX) in an SOI substrate, although it may also be created by other means. A body layer 106 is formed on the barrier layer 104, and may be formed of single crystalline silicon by an epitaxy method or by the SOI substrate fabrication process. In the SOI device shown in FIG. 1, each device is fully isolated from every other device in the array. As shown in FIG. 1, the devices 101, 103 and 105 are separated by isolation layers 108. The isolation layers 108 are formed within body layer 106 and may be formed of an insulating layer, such as a high density plasma oxide layer and/or a silicon oxide layer by chemical vapor deposition, or similar methods. As shown in FIG. 1A, the isolation layers 108 extend to the surface or near the surface of the barrier layer 104. Isolation regions can be provided in two dimensions, however such isolation regions are typically created using lithography methods. That is, they are pre-etched before the gate is formed as done in a standard STI (shallow trench isolation) process. Consequently, the isolation regions are strictly bound by lithography dimension requirements.

In FIG. 1, the gate 110 is separated from the underlying silicon body 106 by a thin gate oxide (not shown) that is also an insulator or insulative layer. This and other layers that may be grown during processing of the device are not shown, but should be understood to be present by those of ordinary skill in the art.

The basic dimension of each cell is defined by the length of the gate 110 of each device. As stated above, this represents the feature size of the transistor (F). For present manufacturing processes, such as illustrated in FIG. 1, the need for substantial isolation between each cell requires that the dimensions of a cell array be a multiple of the individual feature size, F. This is due to the fact that present lithography-based technologies require a minimum printable feature size. This further adds to increased spacing between cells in an array, as well as extra photolithography processing steps.

What is desired, therefore, is a device manufacturing process that creates cell arrays of a minimal dimension and that is not limited by present lithography node rules.

What is further desired is a process that creates a self-aligned lateral isolation for an SOI recessed gate device.

What is yet further desired is a device manufacturing process that efficiently creates an underlap device to reduce the gate induced drain leakage (GIDL) effect.

INCORPORATION BY REFERENCE

Each patent, patent application, and/or publication mentioned in this specification is herein incorporated by reference in its entirety to the same extent as if each individual patent, patent application, and/or publication was specifically and individually indicated to be incorporated by reference.

BRIEF DESCRIPTION OF THE DRAWINGS

In the course of the detailed description to follow, reference will be made to the attached drawings. These drawings show different aspects of embodiments of the present invention and, where appropriate, reference numerals illustrating like structures, components, materials and/or elements in different figures are labeled similarly. It is understood that various combinations of the structures, components, materials and/or elements, other than those specifically shown, are contemplated and are within the scope of the described embodiments. Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed in combination with one or more other aspects of the present inventions, and/or embodiments thereof. For the sake of brevity, many of those permutations and combinations are not discussed separately herein.

Embodiments of the present invention are illustrated by way of example and not limitation in the figures of the accompanying drawings, in which like references indicate similar elements and in which.

DETAILED DESCRIPTION OF EMBODIMENTS

Figure 1:
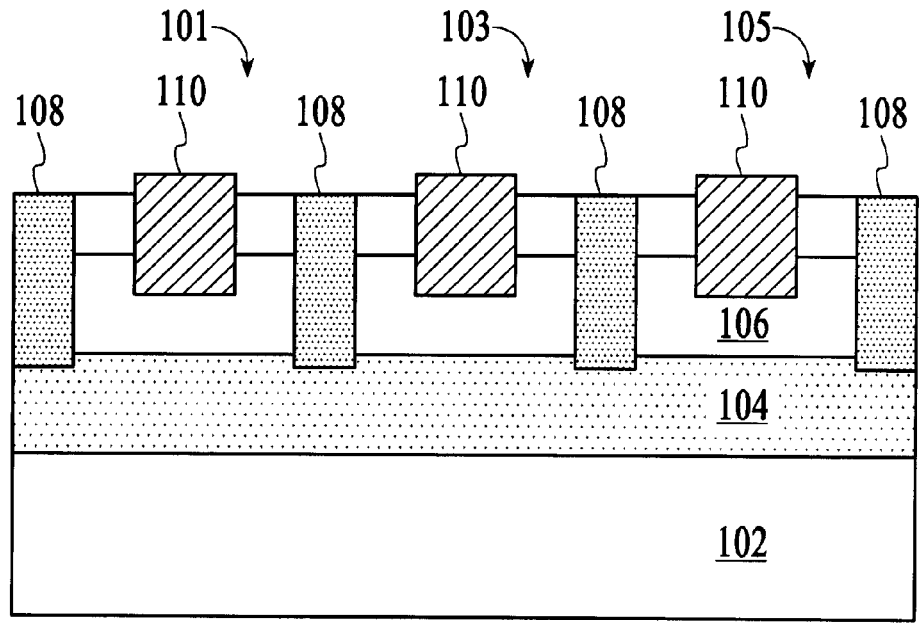
FIG. 1 illustrates a partial array of floating-body, Silicon-on-Insulator integrated circuit devices, produced by prior art processes.

Embodiments of a manufacturing process for producing recessed-gate, Silicon-on-Insulator integrated circuit devices with self-aligned, lateral isolation, are described. The process according to these embodiments allows for the creation of true in-pitch recessed gate devices without requiring an extra isolation dimension. A lateral isolation trench is formed between pairs of recessed gate devices by etching the silicon-on-insulator area down to a buried oxide layer on which the silicon-on-insulator layer is formed. The position of the trench is self-aligned and defined by the gate length and the dimension of spacers disposed on either side of the gate. The trench is formed by a non-lithographic etch process. The isolation trench is filled with a dielectric material and then etched back to somewhere in the middle of the SOI body, the location being as required by the optimization of the device characteristics. The remaining volume of the trench is filled with a doped conductive material such as an in-situ, n-doped poly material, although any dopant type or species can be used as necessary to create the correct device characteristics. The doped conductor is subject to a thermal cycle to create source and drain regions of the device through out-diffusion of the doped material. The source and drain regions may be formed at a defined distance from the gate to produce an underlapped device that is advantageously immune to gate induced drain leakage effects.

In the following description, numerous specific details are introduced to provide a thorough understanding of, and enabling description for, embodiments of an integrated circuit manufacturing process. One skilled in the relevant art, however, will recognize that these embodiments can be practiced without one or more of the specific details, or with other components, systems, and so on. In other instances, well-known structures or operations are not shown, or are not described in detail, to avoid obscuring aspects of the disclosed embodiments.

Silicon-on-Insulator (SOI) processes refer to the use of a layered silicon-insulator-silicon substrate instead of conventional silicon substrates in semiconductor manufacturing. Unlike conventional CMOS chips, where a transistor is placed directly on the surface of a silicon substrate, an SOI device has a thick layer of insulator (typically silicon dioxide) between the transistor and the silicon substrate to efficiently isolate transistors from the substrate. Note that after creation of a lateral isolation, the transistors become fully isolated from adjacent devices. On standard SOI wafers, there is a buried oxide layer that covers the complete surface of the wafer, and this use of a layered silicon-insulator-silicon substrate in place of a conventional silicon substrate generally reduces parasitic device capacitance or leakages and thereby improves device performances. SOI-based devices also differ from conventional silicon-built devices in that the silicon junction is above an electrical insulator, which typically is silicon dioxide.

Embodiments are directed to a manufacturing process that creates a recessed gate structure on an SOI substrate that features self-aligned lateral isolation. The lateral isolation dimension is sub-feature size so that an array of devices can be made substantially smaller than is allowed by present lithography techniques. The isolation regions between each device in the array are self-aligned to the gate and spacer of an adjacent device and are formed during post-gate production using a non-patterned process so that no etch tolerance is required for overlap error. This allows the creation of a fully isolated device that is of dimension $4F^2$ as opposed to 6 to $8F^2$, which is the typical size for devices in present DRAM arrays with full isolation. Such a method is particularly useful in, but not limited to, applications related to the manufacture of new generation memory devices.

Figure 2:
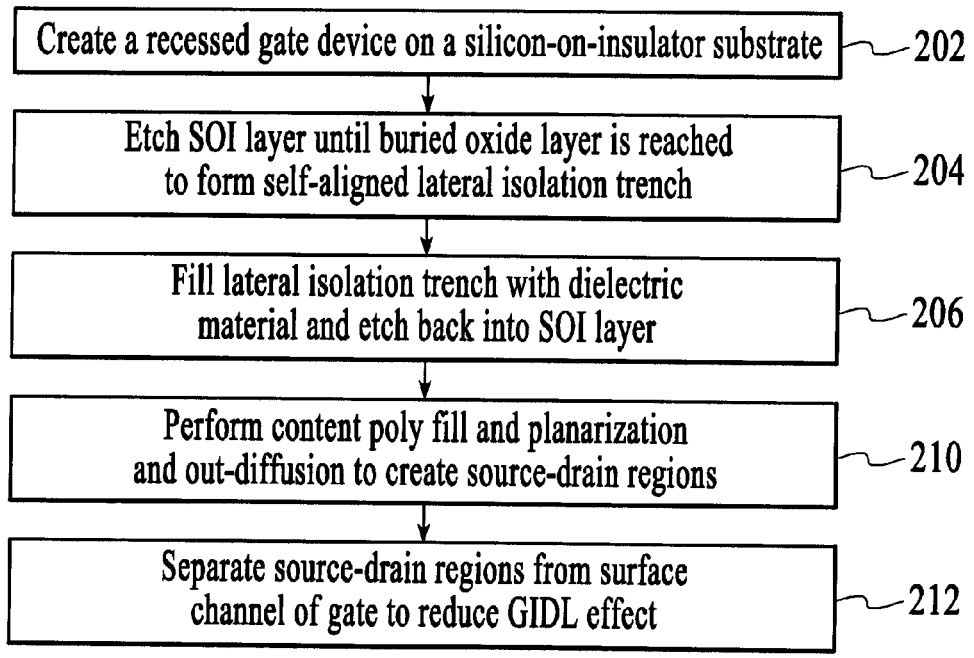
FIG. 2 is a flowchart illustrating a process of producing a recessed gate device, Silicon-on-Insulator device with self-aligned lateral isolation, under an embodiment.

FIG. 2 is a flowchart illustrating an overall process of producing a recessed gate SOI with self-aligned lateral isolation, under an embodiment. The process first creates a recessed gate device on an SOI substrate, process block 202. This step may utilize standard known methods of creating a recessed gate device. During this step, spacers are formed and an interlayer dielectric (ILD) layer is filled and planarized. This is followed by a contact etch process 204 in which the SOI layer is etched until the buried oxide layer is reached so that a self-aligned lateral isolation trench is formed. In process block 206, the lateral isolation trench is filled with a dielectric material, and then etched back to the SOI layer. Source-drain regions are then created through content poly fill, planarization, and out-diffusion processes, block 210. The source-drain regions are then separated from the surface channel of the gate to reduce to reduce possible gate induced drain leakage (GIDL) effects, block 212. Details of each of the process blocks of FIG. 2 are provided in the description that follows.

Figure 3:
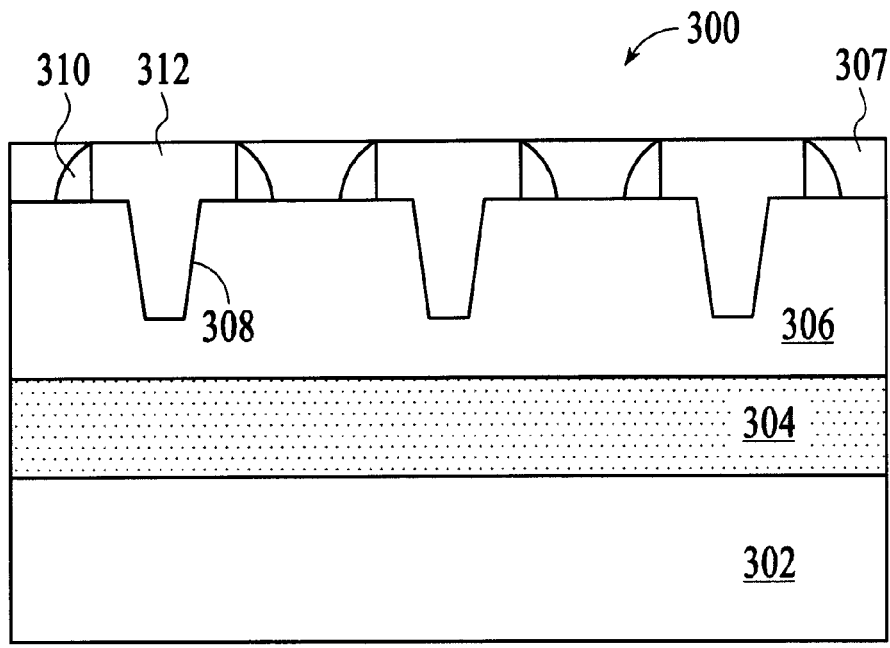
FIG. 3 illustrates an initial process step of producing a recessed gate device, Silicon-on-Insulator device with self-aligned lateral isolation, under an embodiment.

FIG. 3 illustrates a cross-sectional view of an array of recessed gate structures produced in block 202 of FIG. 2, under an embodiment. A partial array 300 of three identical devices, shown across a single row, is illustrated. The full array may be four, eight, or any number of devices, depending upon the specific device architecture. Embodiments of the process of FIG. 2 can be applied to arrays of any appropriate number of devices.

As shown in FIG. 3, a buried oxide layer 304 is present on a substrate layer 302, and an SOI layer 306 is present on the buried oxide layer 304. Each device has a recessed gate area 308 which may be formed by an etch process in which a mask pattern is placed over the SOI body layer 306 to allow partial removal of material to form the recess region 308. Spacers 310 are formed on either side of the gate 312. The spacers 310 are of a defined width depending on the desired circuit dimensions and constraints of the manufacturing system. In one embodiment, silicon nitride and silicon dioxide are used as the spacer and insulative materials respectively. Alternatively, any suitable materials that have high etch selectively may also be used, such as Tantalum Oxide ($Ta_2O_5$), Titanium Oxide ($TiO_2$), Zirconium Oxide ($ZrO_2$), Hafnium Oxide ($HfO_2$), Aluminum Oxide ($Al_2O_3$), and other such insulators or combinations of insulators. In general, the spacer region and the top layer of the poly gate are made of the same material, and the gap region is filled with a different insulative or dielectric material. In certain cases, the spacer region and the top layer of the poly gate may be of different materials, as long as selectivity to the interlayer dielectric (ILD) and silicon layers is achieved.

Once the recessed gate structures are formed in block 202, a self-aligned lateral isolation trench is formed to provide isolation between the devices of the array. As shown in FIG. 2, this step involves etching through the dielectric layer 307 and the SOI layer 306 all the way down to the buried oxide layer 304, block 204. In an embodiment, this step can be combined with the self aligned contact etch process.

In FIG. 3 and the following related figures, the gate 312 is separated from the underlying silicon body 306 by a thin gate oxide (not shown) that is also an insulator or insulative layer. This and other layers that may be grown during processing of the device are not shown to simplify the figures and to prevent unduly complicating the description.

Figure 4:
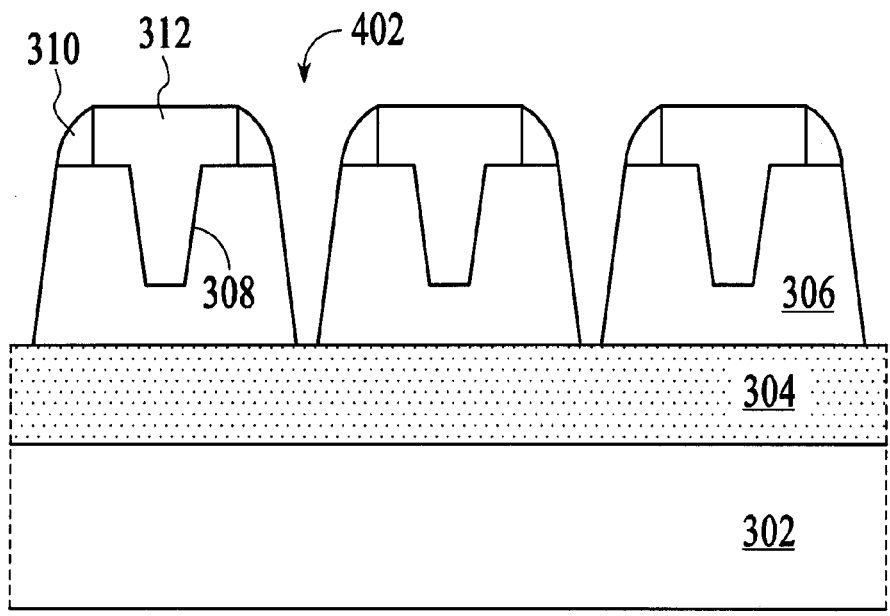
FIG. 4 illustrates a subsequent process step of producing a recessed gate device, Silicon-on-Insulator device with self-aligned lateral isolation, under an embodiment.

FIG. 4 illustrates a cross-sectional view of an array of recessed gate structures produced in block 204 of FIG. 2, under an embodiment. The etch step of block 204 creates a lateral isolation trench 402 between each pair of devices. The lateral isolation trench 402 defines a self-aligned contact area for each adjacent device. The width of lateral isolation trench 402 is defined by the width of adjacent pairs of spacers 310 disposed on either side of each device gate 312. The lateral isolation trench 402 is self-aligned to the gate and spacers of neighboring devices. In a preferred embodiment, the lateral isolation trench 402 is created through an etch process that does not require any lithography processes. For this embodiment, the spacers 310 are made of Silicon Nitride, and the etch can be made to be selective to Silicon, but not Silicon Nitride. Because lithography is not used to produce the contact area 402, the contact area is not constrained by design rules or the need for overlay tolerances. Because the isolation trench is self aligned to the device gate/spacer, there is no need to provide a tolerance to ensure that the gate is precisely between a pair of isolation regions. This eliminates the need to increase the space between devices by the overlay tolerance. For example, if the gate width is on the order of 54 nm, the contact area 402 can be on the order of 20 nm or less.

With reference to FIG. 2, as shown in block 206, once the lateral isolation trench for the contact area is formed, it is partially filled with a dielectric material, such as Silicon Oxide. In one embodiment, the partial fill is performed by filling the trench 402 back to the top or near the top of the dielectric layer 307 and then etching back down through the dielectric layer and through a portion of the SOI layer.

For the embodiment of FIG. 4, the isolation trench 402 is illustrated as a tapered trench that is narrower at the bottom than at the top. This shape reduces the possibility of creating a fill seam. Alternatively, the sides of the trench may be vertical or substantially vertical. In this case, as long as the sides are completely isolated with dielectric, it does not matter whether or not there is a fill seam. Other profiles may be possible as well, such as a trench that expands at the bottom or has a rounded cross-sectional aspect to create a more optimum electrical field. Alternatively, the trench can be formed to have rounded aspect so that the bottom is curved. The actual shape of the trench can be controlled by standard trench formation techniques, such as altering the passivation amount to control the rate and direction of the etch process.

Figure 5:
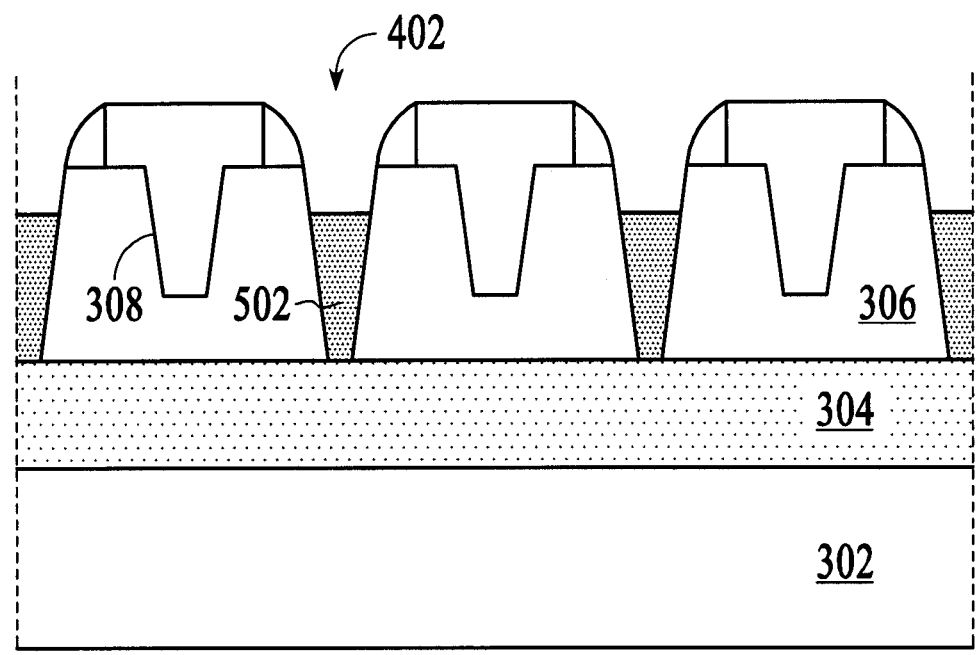
FIG. 5 illustrates a further subsequent process step of producing a recessed gate device, Silicon-on-Insulator device with self-aligned lateral isolation, under an embodiment.

FIG. 5 illustrates a cross-sectional view of an array of recessed gate structures produced in block 206 of FIG. 2, under an embodiment. As shown in FIG. 5, isolation trench 402 is partially filled with a dielectric material 502. The dielectric material should be filled to an amount so that it is below the top of the silicon layer 306 and above the bottom of the recessed gate 308. The exact height of the dielectric material 502 within trench 402 may be determined by a number of factors, such as the out-diffusion methodology to create the source and drain regions of the device, as well as the gate size and gate recess depth. Other factors may also be considered in determining this process feature, depending upon the constraints and requirements of the device.

The remaining hole area created by the partial etch of the dielectric material within the isolation trench is then filled with highly doped polysilicon. The procedure can be performed in several different ways, such as predoping the area with angled implants, and other similar techniques.

Figure 6:
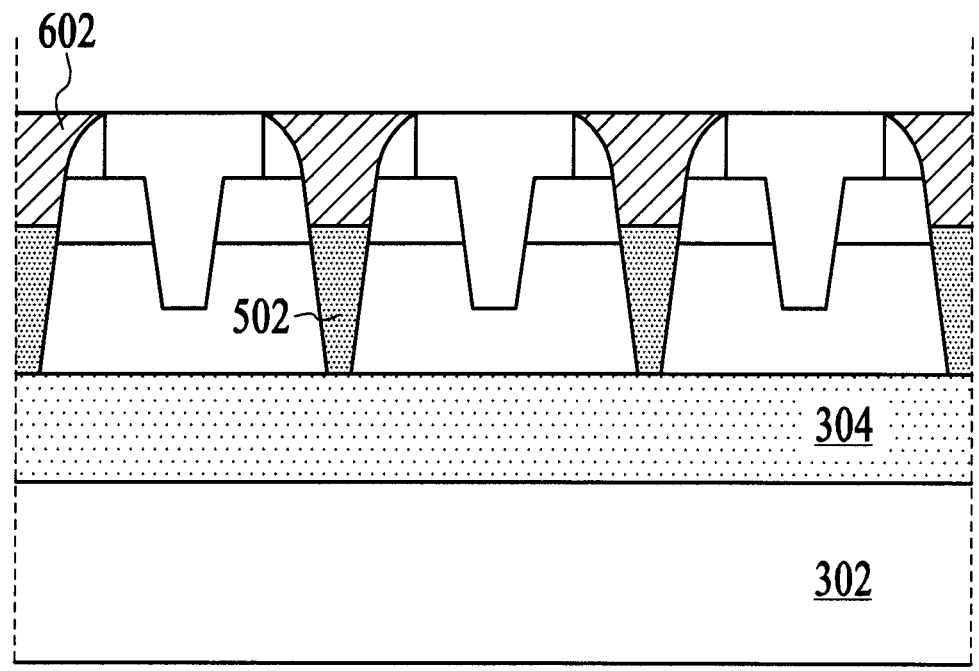
FIG. 6 illustrates a yet further subsequent process step of producing a recessed gate device, Silicon-on-Insulator device with self-aligned lateral isolation, under an embodiment.

FIG. 6 illustrates the filling of the isolation trench above the silicon dioxide layer with a portion of doped polysilicon, under an embodiment. As can be seen in FIG. 6, a layer of doped polysilicon 602 is deposited above the silicon oxide layer 502 in isolation trench 402. The doped polysilicon layer fills the isolation trenches to the top of the dielectric material 502 level in each isolation trench 402. As shown in block 210 of FIG. 2, the doped polysilicon fill material 602 is then planarized to be made flush with the dielectric layer 307. A thermal cycle then applied to out-diffuse the doped conductor material to form the source and drain regions of the device. The fill material can be accomplished by any appropriate planarization technique, such as CMP (Chemical Mechanical Planarization).

Figure 7:
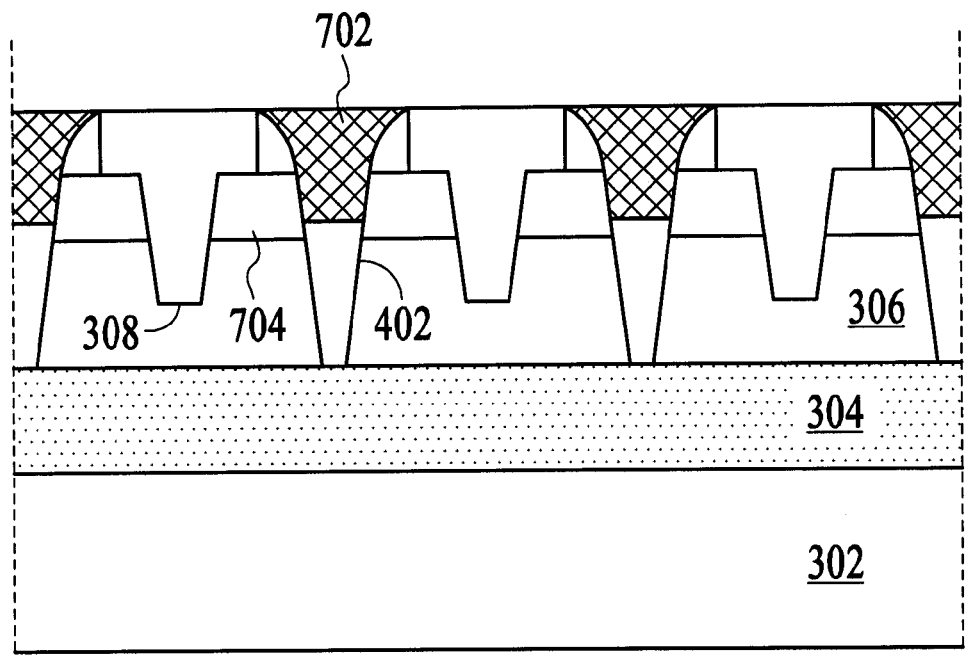
FIG. 7 illustrates devices with source and drain regions produced by out-diffusion of the doped polysilicon layer, under an embodiment.

FIG. 7 illustrates devices with source and drain regions produced by out-diffusion of the doped polysilicon layer, under an embodiment. The planarized doped conductor 702 out-diffuses when subject to a thermal cycle to form doped source and drain regions 704. Depending upon process requirements and constraints, one or more thermal cycles can be applied to the doped polysilicon to create source and drain regions proximate the floating body region. The embodiment of FIG. 7 shows a standard configuration of the source and drain region 704 in a recessed gate device. That is, the source and drain regions 704 extend from the isolation trench 402 to the recessed gate 308.

In an alternative embodiment, the source and drain regions that are created by the out-diffusion process of the doped polysilicon can be in formed in various different orientations and sizes with respect to the isolation trench and the recessed gate. In one embodiment, the thermal cycle is shortened so that the doped polysilicon 702 only partially diffuses. For this embodiment, the source and drain region do not extend to the gate oxide region. This is illustrated as block 212 of FIG. 2.

Alternate techniques to the doped polysilicon diffusion process may be used to create the source and drain areas. For example, other solid source diffusion techniques or various implantation techniques may be used.

Figure 8:
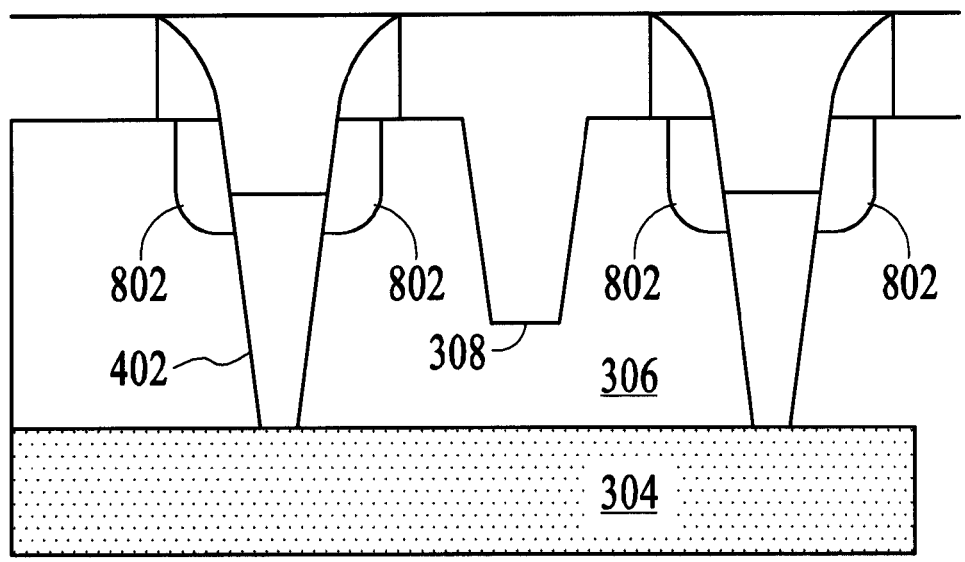
FIG. 8 illustrates the formation of source and drain regions in a recessed gate device, under an alternative embodiment.

FIG. 8 illustrates the formation of source and drain regions in a recessed gate device, under an alternative embodiment. As shown in FIG. 8, the source and drain regions 802 extend from the Silicon Oxide filled trench 402, but do not extend to the gate oxide region of recessed gate 308.

In general, the electric field is a device is at its highest concentration just beneath the gate of the device. This electric field can create a problem known as Gate Induced Drain Leakage (GIDL). FIG. 8 illustrates an underlapped device which can reduce the GIDL effect by removing the source and drain regions from the immediate proximity of the gate. The amount of underlap determined by the distance of the source/drain region from the gate oxide area can be altered depending on various factors such as gate size, tolerance to drain leakage, device turn-on and turn-off requirements, and the like. In the underlap device of FIG. 8, the electric field from the gate interacts minimally with the source-drain junction. This arrangement is an inherent feature of the manufacturing process according to embodiments. By altering one or more processing parameters, any degree of underlap may be produced.

Although embodiments have been described with respect to specific materials and processing methods, it should be understood that various alternatives are possible. For example, in one embodiment of the memory array produced by a method according to embodiments, the spacer 310 comprises silicon nitride ($Si_3N_4$), as does the insulative layer of the poly gate. The area between the spacers contacts the source/drain areas, and is filled with a dielectric material, such as silicon dioxide ($SiO_2$). After the nitride spacers have been formed, the silicon dioxide layer is deposited and then polished to allow for straight line lithography on a planar surface. The elongated line defined by the spacers is etched using a selective etch process that removes the insulative material down to the silicon layer. The silicon nitride comprising the spacer region and the film on top of the conductive gate, act as an etch stop.

Embodiments of the device array manufacturing process can be applied to any type of transistor based integrated circuit device or array that is manufactured in layers using photolithographic techniques. In general, embodiments can be used to produce any type of device in which a long transistor is required in a small area. Embodiments can also be used to produce standalone memory devices. In general, methods according to embodiments can be used to produce standalone memory devices based on single transistor bit cells, and such devices can encompass Z-RAM® cells, or any similar memory cell that does not require a trench capacitor or similar component.

Aspects of the embodiments described herein may include a method of fabricating semiconductor memory cells comprising: forming a plurality of recessed gate devices on a silicon-on-insulator substrate formed over a buried oxide layer, each recessed gate device comprising a floating body region and spacers disposed on opposite sides of the floating body region; etching the silicon-on-insulator substrate until the buried oxide layer is reached to form a lateral isolation trench aligned to the gate by the spacer width; partially filling the lateral isolation trench with a dielectric material; filling a remaining portion of the lateral isolation trench with doped polysilicon; and thermally cycling the doped polysilicon to create source and drain regions proximate the floating body region. In an embodiment, the source and drain regions extend from the lateral isolation trench to the gate region. In an alternative embodiment, the source and drain regions extend from the lateral isolation trench and do not contact the gate region.

In an embodiment, contact areas of a device are formed by a computer-controlled fabrication process executing instructions operable to: define an insulative spacer region on opposing sides of a silicon-on-insulator transistor gate, create a lateral isolation trench between two adjacent transistor gates that is self-aligned to the gates and that is formed through a non-lithographic process so as to be unconstrained by lithography design rules to form an array of SOI devices that are isolated by sub-feature size isolation regions.

A semiconductor manufacturing process according to embodiments may be implemented in a computer or machine implemented system executed on a digital processing system that controls one or more manufacturing machines. Aspects of the manufacturing process and process flow described herein may be executed by a computer executing program instructions, or as functionality programmed into any of a variety of circuitry for semiconductor processing programs or equipment. Such programs and equipment can be embodied in various different circuits, components, or systems, including programmable logic devices ("PLDs"), such as field programmable gate arrays ("FPGAs"), programmable array logic ("PAL") devices, electrically programmable logic and memory devices and standard cell-based devices, as well as application specific integrated circuits. Some other possibilities for implementing aspects of the semiconductor manufacturing system include: microcontrollers with memory (such as EEPROM), embedded microprocessors, firmware, software, etc. Furthermore, aspects of the described method may be embodied in microprocessors having software-based circuit emulation, discrete logic (sequential and combinatorial), custom devices, fuzzy (neural) logic, quantum devices, and hybrids of any of the above device types.

It should also be noted that the various functions disclosed herein may be described using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, and so on).

Unless the context clearly requires otherwise, throughout the description and any present claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

The above description of illustrated embodiments of the semiconductor manufacturing process and system is not intended to be exhaustive or to limit the embodiments to the precise form or instructions disclosed. While specific embodiments of, and examples are described herein for illustrative purposes, various equivalent modifications are possible within the scope of the described embodiments, as those skilled in the relevant art will recognize.

The elements and acts of the various embodiments described above can be combined to provide further embodiments. These and other changes can be made to the semiconductor manufacturing process in light of the above detailed description.

In general, in the following, the terms used should not be construed to limit the described system to the specific embodiments disclosed in the specification, but should be construed to include all operations or processes that operate thereunder.

While certain aspects of the disclosed method and system may be presented below in certain forms, the inventor contemplates the various aspects of the methodology in any number of forms. For example, while only one aspect of the describe process may be recited as embodied in machine-readable medium, other aspects may likewise be embodied in machine-readable medium. Such computer readable media may store instructions that are to be executed by a computing device (e.g., personal computer, personal digital assistant, PVR, mobile device or the like) or may be instructions (such as, for example, Verilog or a hardware description language) that when executed are designed to create a device (GPU, ASIC, or the like) or software application that when operated performs aspects described above. The claimed invention may be embodied in computer code (e.g., HDL, Verilog, etc.) that is created, stored, synthesized, and used to generate GDSII data (or its equivalent). One or more semiconductor devices, arrays, circuits or any combination thereof may then be manufactured based on this data.

The invention claimed is:

1. A method for manufacturing a memory array, the method comprising:
    forming a plurality of recessed gate devices on a silicon-on-insulator substrate over a buried oxide layer, the plurality of recessed gate devices defining the memory array;
    defining an insulative spacer region on opposing sides of a recessed transistor gate associated with one of the plurality of recessed gate devices;
    etching the silicon-on-insulator substrate until the buried oxide layer is reached to form a lateral isolation trench aligned to the recessed transistor gate by a width of the insulative spacer region;
    partially filling the lateral isolation trench with a dielectric fill material;
    filling a remaining portion of the lateral isolation trench with doped polysilicon; and
    thermally cycling the doped polysilicon to create source and drain regions for each recessed gate device.

2. The method of claim 1 wherein recessed transistor gate extends into the silicon-on-insulator substrate further than the source and drain regions.

3. The method of claim 2 wherein each recessed gate device comprises a floating body region and spacers disposed on opposite sides of a gate region.

4. The method of claim 3 wherein the lateral isolation trench defines a self-aligned contact area for each recessed gate device adjacent the lateral isolation trench.

5. The method of claim 4 wherein the spacers comprise a silicon nitride material placed adjacent to the floating body region.

6. The method of claim 3 wherein the source and drain regions extend from the lateral isolation trench to the gate region.

7. The method of claim 3 wherein the source and drain regions extend from the lateral isolation trench and do not contact the gate region to produce an underlapped device array in order to reduce a gate induced drain leakage effect associated with each recessed gate device of the array.

8. The method of claim 4 wherein the lateral isolation trench is configured to a cross section selected from the group consisting of: substantially vertical sides extending from a top surface to the buried oxide layer, tapered sides extending inwardly from a top surface to the buried oxide layer, and tapered sides extending outwardly from a top surface to the buried oxide layer.

9. The method of claim 3 wherein a width of the lateral isolation trench is defined by a width of the spacers disposed on opposite sides of the gate region.

10. At least one non-transitory processor readable storage medium storing a computer program of instructions configured to be readable by at least one processor for instructing the at least one processor to execute a computer process for performing the method as recited in claim 1.

* * * * *